United States Patent [19]

Richman

[11] 3,867,196

[45] Feb. 18, 1975

[54] METHOD FOR SELECTIVELY ESTABLISHING REGIONS OF DIFFERENT SURFACE CHARGE DENSITIES IN A SILICON WAFER

[75] Inventor: Paul Richman, Saint James, N.Y.

[73] Assignee: SMC Microsystems Corporation, Hauppauge, L.I., N.Y.

[22] Filed: Mar. 11, 1974

[21] Appl. No.: 450,178

[52] U.S. Cl. ..................... 148/1.5, 148/187, 357/42
[51] Int. Cl. ............................................. H01l 7/34
[58] Field of Search ...................... 148/1.5, 175, 187

[56] References Cited

UNITED STATES PATENTS 3,472,689 10/1969 Scott, Jr. ......................... 148/175 X
3,793,088 2/1974 Eckton, Jr. ......................... 148/1.5

*Primary Examiner*—L. Dewayne Rutledge
*Assistant Examiner*—J. M. Davis
*Attorney, Agent, or Firm*—Sandoe, Hopgood & Calimafde

[57] ABSTRACT

A process is described whereby regions having selectively different values of fixed positive surface charge density, Qss, are formed on a common silicon wafer. In the process, a material which acts as a barrier to oxygen, such as silicon nitride, is placed over a selected portion of the surface of the silicon, thereby to simulate a final anneal in an inert atmosphere only at the portion of the silicon surface underlying the oxygen barrier and to establish there a minimum value of Qss.

6 Claims, 5 Drawing Figures

Figure 1A:
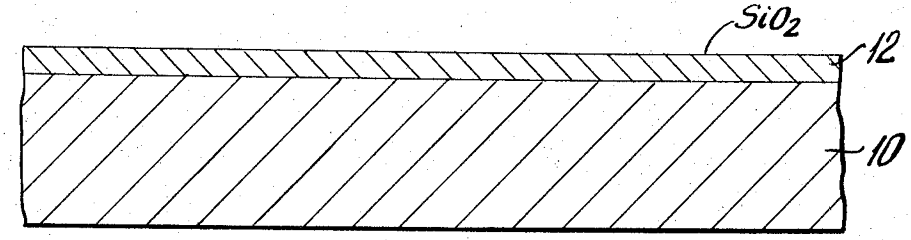
Figure 1B:
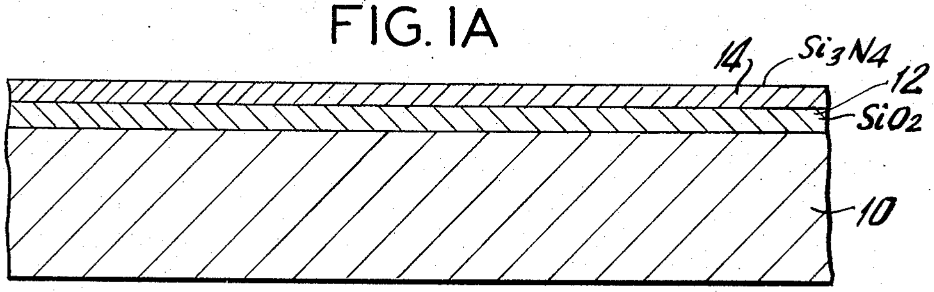
Figure 1C:
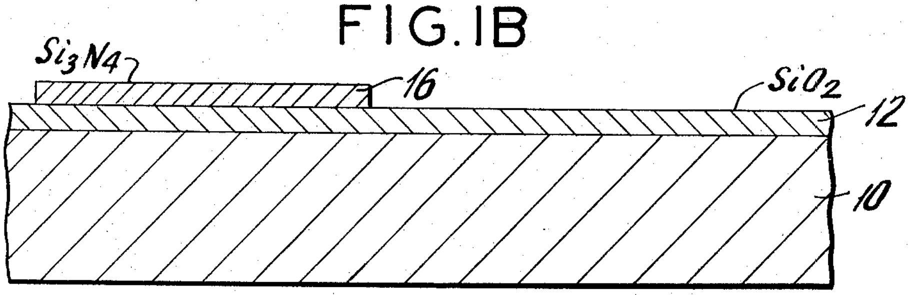
Figure 1D:
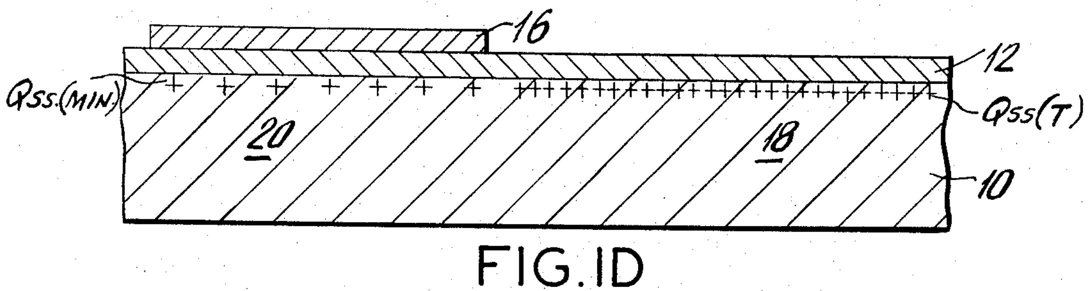

METHOD FOR SELECTIVELY ESTABLISHING REGIONS OF DIFFERENT SURFACE CHARGE DENSITIES IN A SILICON WAFER

The present invention relates generally to semiconductor circuits, and more particularly to a process for forming an MOS circuit in which different values of fixed positive interface charge density, or Qss, are selectively established at different regions on a common silicon wafer.

The existence of a fixed positive charge density has been identified near the silicon-silicon dioxide interface of moderately doped p- and n-type silicon substrates. This surface charge density, which is denoted per unit area, by Qss, is of primary interest to the designer of MOS devices and circuits, primarily because of its role in establishing significant electrical characteristics of the MOS device. For example, the threshold voltage of MOS devices, such as MOSFETs, and the field inversion voltage of MOS integrated circuits are both functions of Qss.

It is known that the value of Qss is a minimum when the final high-temperature anneal to which the silicon wafer is subjected is carried out in an inert atmosphere, such as nitrogen, at a temperature between 700°C and 1200°C, and is essentially constant over this temperature range. However, when the final anneal is performed in a wet or dry oxygen environment, the magnitude of Qss is greater than the minimum value, and increases with decreasing temperature. The value of Qss in a silicon wafer can thus be controlled by varying the temperature and/or the amount of ambient water vapor at the final high-temperature anneal. Additional information on the fixed positive interface charge density is provided in applicant's book "MOS Field-Effect Transistors and Integrated Circuits", pp. 142–144, John Wiley & Sons, 1973.

The ability to have selectively and controllably higher and lower values of Qss on a single silicon wafer is desirable for at least the following reasons:

1. It would enable the fabrication of both enhancement and depletion n-channel MOS devices on a single silicon wafer without the use of costly and complex ion implantation techniques;

2. It would enable the MOS designer to selectively achieve different values of threshold voltages and field inversion voltages on the same silicon wafer;

3. It would, in general, provide the MOS designer with greater flexibility in the design of MOS devices and circuits;

4. It would be useful in achieving asymmetrical surface potential characteristics for charge-coupled devices formed on a single silicon wafer.

Although it would be of considerable benefit to the MOS designer to be able to selectively provide different magnitudes of Qss on a single silicon wafer, no method has heretofore been proposed or developed for doing so. It is, therefore, an object of the invention to provide a process, whereby the value of Qss can be selectively varied at relatively high and low levels on a single silicon wafer.

It is another object of the invention to provide a process of the type described in which greater flexibility of the design of MOS devices is achieved in a reliable and inexpensive manner.

In the method of the invention, a barrier to oxygen, such as a layer of silicon nitride ($Si_3N_4$), is placed over a preselected portion of a major surface of an oxidized silicon wafer prior to the final anneal of the wafer in an oxygen environment. The portion of the silicon underlying the oxygen barrier undergoes a simulated anneal in an inert atmosphere, since no oxygen can penetrate the barrier during the anneal, such that the magnitude of Qss in the silicon underlying the barrier is established at a minimum value. The remaining portion of the silicon substrate that is not covered by the oxygen barrier is annealed in an oxygen atmosphere such that the magnitude of Qss established in this portion of the silicon is at a level corresponding to the annealing temperature and the amount of ambient water vapor.

Figure 2:
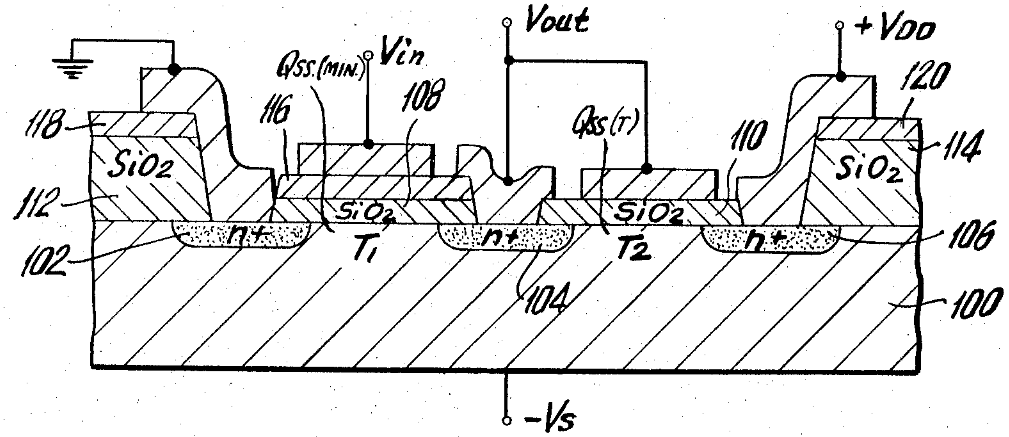

To the accomplishment of the above and to such further objects as may hereinafter appear, the present invention relates to a method for selectively establishing regions of different surface charge densities in a silicon wafer, substantially as defined in the appended claims and as described in the following specification taken together with the accompanying drawing in which:

FIGS. 1 (*a*) – 1 (*d*) schematically illustrate a silicon substrate as it appears during the various steps of the method of the invention; and FIG. 2 is a schematic illustration of an MOS circuit illustrating enhancement and depletion n-channel MOS devices formed on a single silicon wafer by the method of the invention.

As shown in FIG. 1 (*a*), the method of the invention is performed on a moderately doped p- or n-type silicon substrate 10 on which a thin layer 12 of silicon dioxide is formed in a conventional manner as by thermal oxidation.

As shown in FIG. 1 (*b*), a film of a material capable of acting as an oxygen barrier, here shown as a silicon nitride ($Si_3N_4$) film 14, is grown over the silicon dioxide layer 12. Silicon nitride film 14 is preferably grown to a thickness of 400 – 3,000 A by a chemical vapor deposition process using the reaction between silicon tetrachloride ($SiCl_4$) and ammonia ($NH_3$) at a temperature of between 650°C and 950°C.

Thereafter, as shown in FIG. 1 (*c*), portions of the silicon nitride film 14 are selectively etched away by a photolithographic masking technique, preferably by the use of phosphoric acid ($H_3PO_4$) as an etchant, to leave a silicon nitride barrier or mask 16 selectively located over a portion of silicon dioxide layer 12 and the surface of silicon substrate 10. The silicon substrate with silicon nitride mask 16 selectively formed thereon, as shown in FIG. 1 (*c*), is subjected to a final anneal in either a dry or wet oxygen environment and at a temperature between 550°C and 1250°C. A typical anneal would be performed at a temperature of 750°C in a dry oxygen environment.

The silicon nitride mask 16 acts as a barrier to the diffusion of oxygen (and water vapor as well) to the underlying silicon substrate such that the effect on the surface charge density in the underlying substrate is the same as that which would occur had the anneal been carried out in an inert atmosphere. That is, the silicon nitride oxygen barrier effectively simulates an anneal in an inert atmosphere for the portion of the silicon substrate that underlies the oxygen barrier, thereby to establish a minimum value of Qss in this portion. The surface charge density established in the remaining portion of the silicon substrate not covered by the silicon nitride oxygen barrier is determined by the temperature and water vapor content as in a conventional oxygen anneal.

Thus, an anneal performed on the device shown in FIG. 1 (*c*), establishes a relatively high surface charge density, indicated as Qss (T) in FIG. 1 (*d*), in a portion 18 of silicon substrate 10 not covered by silicon nitride mask 16 that bears a relation to the anneal temperature and water vapor content. On the other hand, the value of Qss established in a portion 20 underlying silicon nitride film 16 is at a minimum value, indicated as Qss (min) in FIG. 1 (*d*), that would be formed in an anneal in an inert atmosphere. The annealed silicon substrate, as shown in FIG. 1 (*d*), thus has selectively formed therein the two regions 18 and 20, having respectively the controllable and different magnitudes of Qss, Qss (min) and Qss (T), as desired.

A typical value of Qss (min)/q that may be obtained in a (111) silicon substrate orientation in performing the method of the invention is approximately $1.5 \times 10^{11}/cm^2$, whereas the value of Qss (T)/q obtained for a final anneal carried out in a dry oxygen environment at a temperature of 750°C is approximately $6.5 \times 10^{11}/cm^2$. If the final anneal were performed in a wet oxygen environment, the value of Qss (min) would be the same since silicon nitride mask 16 would act as a barrier to water vapor as well. The value of Qss (T)/q which would be established in a (111) substrate orientation by a wet oxygen anneal at a temperature of 750°C would be approximately $5 \times 10^{11}/cm^2$ and would also be an inverse function of the anneal temperature. For (110) and (100) silicon substrate orientations, the relative values of Qss (min) and Qss (T) are substantially the same as in a (111) silicon substrate orientation, although the absolute values of both Qss(min) and Qss(T) at corresponding anneal conditions are respectively about ⅔ and ⅓ of the values obtained in a (111) silicon substrate orientation.

FIG. 2 schematically illustrates an MOS integrated circuit formed according to the method of the invention in which the surface of a single silicon wafer contains selectively formed portions having relatively high and low values of Qss, to respectively form enhancement and depletion field-effect transistors T1 and T2 on the wafer. Transistors T1 and T2 constitute an inverter in which the enhancement-type transistor T1 acts as a switch-driver and is normally in the off or non-conductive state. The depletion-type load transistor T2 is normally in the on or conductive state.

The inverter of FIG. 2 is formed on a single wafer of p-type silicon 100 which, as shown, is of a (100) substrate orientation. A plurality of spaced n+-type diffused regions 102, 104, and 106 are formed in the upper major surface of the silicon substrate in a conventional manner and serve as the source and drains of transistors T1 and T2, region 104 being common to both transistors.

Silicon dioxide films 108 and 110 formed on the upper surface of substrate 100 serve as the gate insulation films for transistors T1 and T2, respectively. In addition, thick silicon dioxide layers 112 and 114 are formed over the field regions of the substrate to suppress parasitic conduction in those regions.

To achieve the desired enhancement-type operation of transistor T1, a silicon nitride film 116 is formed over gate insulation film 108 prior to the anneal, as described above, such that a minimum value of Qss is established in the gate-channel region of transistor T1 by the final high temperature anneal. The absence of a silicon nitride film over the gate insulation film of transistor T2 permits the magnitude of Qss to be established at a level higher than Qss(min) as a function of the anneal temperature and ambient conditions of oxygen and water vapor. The relatively high and low magnitudes of Qss on the same silicon wafer thus established provide the desired enhancement and depletion modes of operation, primarily by selectively achieving positive and negative threshold voltages in these regions, without the use of ion implantation techniques as has heretofore been required.

Silicon nitride films 118 and 120 are also formed on the upper surfaces of thick silicon oxide layers 112 and 114 respectively, so that the magnitudes of the surface charge, Qss, underlying these layers are both at the minimum value, thereby establishing a high field inversion voltage in these regions. This further reduces the possibility of parasitic conduction between neighboring MOS devices.

To complete the circuit, aluminum interconnects are made with the source and drain regions and with the gate insulation films. The aluminum interconnects are in turn connected in a conventional manner to ground and to the desired input, output and power supply voltages as shown schematically in FIG. 2.

The method of the invention thus satisfies the objects set forth above in that it enables the designer of MOS devices and circuits to selectively achieve low and high magnitudes of Qss at different portions of a single silicon wafer, in a reliable manner requiring only a minimum of processing steps. The method is suitable, for example, in forming both enhancement and depletion-type MOS devices on a common silicon wafer in an economical manner.

Whereas the invention has been herein described with respect to certain embodiments, it will be apparent that modifications, such as employing materials other than silicon nitride as the oxygen barrier, may be made therein without necessarily departing from the spirit and scope of the invention.

What is claimed is:

1. A process for fabricating a semiconductor integrated circuit comprising the steps of providing a silicon substrate, forming a silicon dioxide layer over said silicon substrate, forming a film of a material having the characteristic of acting as a barrier to oxygen over a selected portion of said oxidized silicon substrate, and thereafter subjecting said silicon substrate to an anneal in an oxygen-containing atmosphere, whereby a minimum value of Qss is established in said portion of said silicon substrate underlying said oxygen-barrier film and a higher value of Qss is established in the remaining portion of said silicon substrate.

2. The process of claim 1, in which said film further acts as a barrier to water vapor and said annealing step is carried out in an environment containing water vapor.

3. The process of claim 2, in which said oxygen-barrier film is a silicon nitride film.

4. The process of claim 1, in which said oxygen-barrier film is a silicon nitride film.

5. The process of claim 4, in which the thickness of said silicon nitride film is between 400 and 3,000 A.

6. The process of claim 4, in which said annealing step is carried out at a temperature of between 550°C and 1250°C.

* * * * *